United States Patent
Höfig et al.

(10) Patent No.: US 10,372,848 B2
(45) Date of Patent: Aug. 6, 2019

(54) METHOD AND APPARATUS FOR PROVIDING A SAFE OPERATION OF A TECHNICAL SYSTEM

(71) Applicant: Siemens Aktiengesellschaft, München (DE)

(72) Inventors: Kai Höfig, München (DE); Marc Zeller, München (DE)

(73) Assignee: SIEMENS AKTIENGESELLSCHAFT (DE)

( * ) Notice: Subject to any disclaimer, the term of this patent is extended or adjusted under 35 U.S.C. 154(b) by 14 days.

(21) Appl. No.: 15/601,053

(22) Filed: May 22, 2017

(65) Prior Publication Data

US 2017/0344673 A1      Nov. 30, 2017

(30) Foreign Application Priority Data

May 25, 2016   (EP) .................................... 16171305

(51) Int. Cl.
*G06F 17/50*      (2006.01)
*G06F 16/30*      (2019.01)
(Continued)

(52) U.S. Cl.
CPC ..... *G06F 17/5009* (2013.01); *G05B 23/0251* (2013.01); *G06F 16/322* (2019.01); *G06F 17/50* (2013.01)

(58) Field of Classification Search
CPC ........... G06F 17/5009; G06F 17/30625; G06F 16/322; G05B 23/0251
(Continued)

(56) References Cited

U.S. PATENT DOCUMENTS

2012/0317058 A1* 12/2012 Abhulimen .......... G06N 99/005
                                                                    706/2
2015/0088476 A1   3/2015 Guo
(Continued)

FOREIGN PATENT DOCUMENTS

EP    2829934 A2    1/2015
EP    2876519 A2    5/2015

OTHER PUBLICATIONS

Extended European Search Report for EP Application No. 16171305. 2, dated Nov. 21, 2016.

*Primary Examiner* — Stacy Whitmore
(74) *Attorney, Agent, or Firm* — Schmeiser, Olsen & Watts, LLP

(57) ABSTRACT

A method and an apparatus for providing a safe operation of a technical system including a plurality of system components. The method includes the steps of: a) providing a safety analysis model matured by knowledge about former implementations of the respective system components in different context, b) whereby system components' dependencies are modeled by connecting inports with outports of the respective system components and/or vice versa, c) whereby at least one or a plurality of such in and/or outports are associated with input failure modes and/or output failure modes, d) characterized in automatically uncovering inconsistencies caused by at least one system component to be integrated in connection with at least another system component whereby the input and/or output failure mode of the system component carries the knowledge from another implementation into the context.

11 Claims, 3 Drawing Sheets

(51) Int. Cl.
*G05B 23/02* (2006.01)
*G06F 16/31* (2019.01)

(58) Field of Classification Search
USPC .......................................................... 716/136
See application file for complete search history.

(56) References Cited

U.S. PATENT DOCUMENTS

2015/0142402 A1* 5/2015 Ramesh .............. G06F 17/5009
703/7
2016/0266952 A1 9/2016 Höfig

* cited by examiner

METHOD AND APPARATUS FOR PROVIDING A SAFE OPERATION OF A TECHNICAL SYSTEM

CROSS-REFERENCE TO RELATED APPLICATIONS

This application claims priority to European application No. EP 16171305.2 having a filing date of May 25, 2016, the entire contents of which are hereby incorporated by reference.

FIELD OF TECHNOLOGY

The following relates generally to a method and an apparatus for providing a safe operation of a technical system comprising a plurality of system components.

BACKGROUND

A technical system in the following context can be safety critical systems (SCS) can comprise a plurality of interconnected components or subsystems. A safety critical system can be a complex safety critical system comprising a plurality of subsystems. Each subsystem can comprise software and/or hardware components. These complex safety critical systems can comprise embedded systems. Nowadays, there is a strong trend to interconnect formerly isolated embedded systems or subsystems to create open, adaptive and heterogeneous systems-of-systems, so-called cyber-physical systems (CPS). Since embedded systems or subsystems often implement safety-relevant functionalities, safety assurance is a major challenge in the design of safety critical systems.

Conventionally, safety analysis techniques are used during the development stage of the safety critical system.

Precise safety analysis models are important during the development of safetycritical systems. The process involved building such models aims at the identication of drawbacks or insufficiencies in terms of safety, such as systematic faults. The resulting safety analysis models can then be used to demonstrate the effectiveness of safety measures. The early identification of drawbacks in terms of safety is crucial for a safe system and a cost efficient development process.

The later in the development process of a product drawbacks are identified, the higher the impact on time and costs. This is particularly true for safety since the quality of safety-critical functions typically depends on many different factors of a system. Examples are the hardware architecture, software-implemented functions, security or even usability of a system. As a result, changes of safety-critical functions effect more and more elements of a system, the more the development process of such a product did proceed. If safety drawbacks are uncovered too late, this can be a real show-stopper especially for complex systems (for example: ICE Trains and so on). But identifying potential drawbacks in terms of safety during the early stages of the development of a safety-critical system is challenging. A reason for this circumstance is that a precise safety analysis requires also precise information about how safety-critical functionality is implemented. With this lack of knowledge about the later system, only brainstorm techniques such as preliminary hazard analysis can be applied to prevent missing safety goals. But these techniques do not aim at competing different realization options against each other, they typically aim at the identification of hazards at the beginning of a safety life-cycle. To select the right option for the realization of safety-critical functionality at early stages of the development, a methodology is required that enables to evaluate different options.

In order to support safety assessment during runtime of the safety critical system safety analysis methodologies are employed which enable an automatic generation of safety cases using component-based models. Component fault trees (CFT) can be used for safety evaluation which enables the reuse and modular composition of safety analysis models. However, component fault trees do not support an automatic construction of safety cases on a system level, since the failure modes of interacting components must be connected by a user manually.

According to the U.S. patent application Ser. No. 14/644,119 a method and apparatus for automated qualification of a safety critical system is known which performs automatically a failure port mapping of output failure modes to input failure modes of component tree elements on the basis of a predetermined generic fault type data model.

This method/apparatus does not fill the gap to reuse information from existing systems.

An aspect relates to providing an approach that integrates information from existing systems into other new and/or existing systems when a system component is reused.

SUMMARY

The above-mentioned object is achieved by a method and one or more apparatus for operating an automation system comprising the features of the independent claim. Preferred embodiments of the invention are described in the dependent claims.

Embodiments of the invention include a method for providing a safe operation of a technical system comprising a plurality of system components, said method comprising the steps of:
a) providing a safety analysis model matured by knowledge about former implementations of the respective system components in different context,
b) whereby system components' dependencies are modeled by connecting inports with outports of the respective system components and/or vice versa,
c) whereby at least one or a plurality of such in and/or outports are associated with input failure modes and/or output failure modes,
d) characterized in automatically uncovering inconsistencies caused by at least one system component to be integrated in connection with at least another system component whereby the input and/or output failure mode of said system component carries the knowledge from another implementation into said context.

The safety analysis model can be effected when a system component is reused.

An aspect of embodiments of the invention is the reused safety analysis model of an already existing component which contains precise safety information. In the worst case it can be completely useless and for some cases the new context is so similar, that no changes are required. But it can be expected that in most cases the reused safety analysis model has to adapt the new context. Possible changes can concern the propagation of failures or the causes contributing to top-level hazards. With this adaptation step, a safety analysis model of a single component is growing each time it is being reused. By switching the context over and over again, the component is analyzed from many different view-points, much more than without reuse. With a good safety culture during this process, a model maturation is expected.

A safety analysis model that has matured during this process includes the knowledge about a component in many different situations or in different context respectively or in different environment respectively and this makes it harder to oversee an important aspect during the safety analysis of a system. As a benefit the maturation effect leads to a reduction of systematic faults at early development stages.

systematic faults definition, reason for uncovering systematic faults (Experience from other situations or environments respectively and other systems)

adding failures and predicting and determining the probability of systematic faults.

Said knowledge and/or experience from another and/or different and/or former implementation can be stored in a repository. The reuse process by maintaining safety analysis models is supported via a repository. In the repository, all safety-relevant information is collected.

The safety analysis model can be represented by a component fault tree comprising a plurality of component fault tree elements, whereby each component fault tree element comprises at least one component fault tree mode element representing a failure mode of the system component which can be represented by the component fault tree element. Inconsistencies are normally detected at the inports and outports of the respective system components.

Different types of inconsistencies when integration a component fault tree of a system component into a network of existing system components are possible:

not all existing output failure modes can be connected to input failure modes of the system component to be integrated, not all existing input failure modes can be connected to output failure modes of the system component to be integrated, not all output failure modes of the system component to be integrated can be connected to existing input failure modes or not all input failure modes of the system component to be integrated can be connected to existing output failure modes.

The input and output failure modes responsible for these inconsistencies can be identified automatically. If the system component to be integrated has a mature system analysis model, its input and output failure modes carry the experience from other implementations into the new system.

For a system component to be integrated into an existing technical system, the failure modes which require integration and unconnected failure modes of this system component which show inconsistencies can be identified, whereby existing knowledge of the system component into a new technical system are transferred where the component is reused. In other words, when a component is reused in a new system, the information from the repository provides an initial model. The knowledge about former implementations of that component is available in the new system. This is called forward maturation.

For a system component to be integrated into an existing technical system, unconnected failure modes of this system component can be identified, whereby existing knowledge of the existing system is transferred back to the reused component of the system, whereby existing instances of the component in other systems or implementations are review.

In other words, the adaptation to a new situation provides new information of the reused component in a different context. This information is synchronized with the information stored in the repository and can be used to mature the safety analysis models of existing implementations of a component. This is called backward maturation.

A further aspect of embodiments of the invention is an apparatus for providing a safe operation of a technical system comprising a plurality of system components, comprising:

a) a modeling unit for providing a safety analysis model matured by knowledge about former implementations of the respective system components in different context,
b) whereby system components' dependencies are modeled by connecting inports with outports of the respective system components and/or vice versa,
c) whereby at least one or a plurality of such in and/or outports are associated with input failure modes and/or output failure modes,
d) an analysis unit for automatically uncovering inconsistencies caused by at least one system component to be integrated in connection with at least another system component whereby the input and/or output failure mode of said system component carries the knowledge from another implementation into said context.

Further embodiments of the apparatus can be applied in an analogous way than the embodiments of the afore mentioned method.

A further aspect of embodiments of the invention is a computer program (product) directly loadable into the internal memory of a computer, comprising software code portions for performing the steps of the above mentioned method when said computer program (product) is running on a computer

BRIEF DESCRIPTION

Some of the embodiments will be described in detail, with reference to the following figures, wherein like designations denote like members, wherein FIG. 1 depicts a block diagram of a possible exemplary embodiment of an apparatus;

Figure 4:
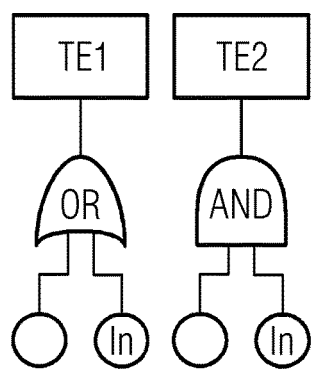

FIG. 4 schematically shows a Classic Fault Tree; and

Figure 5:
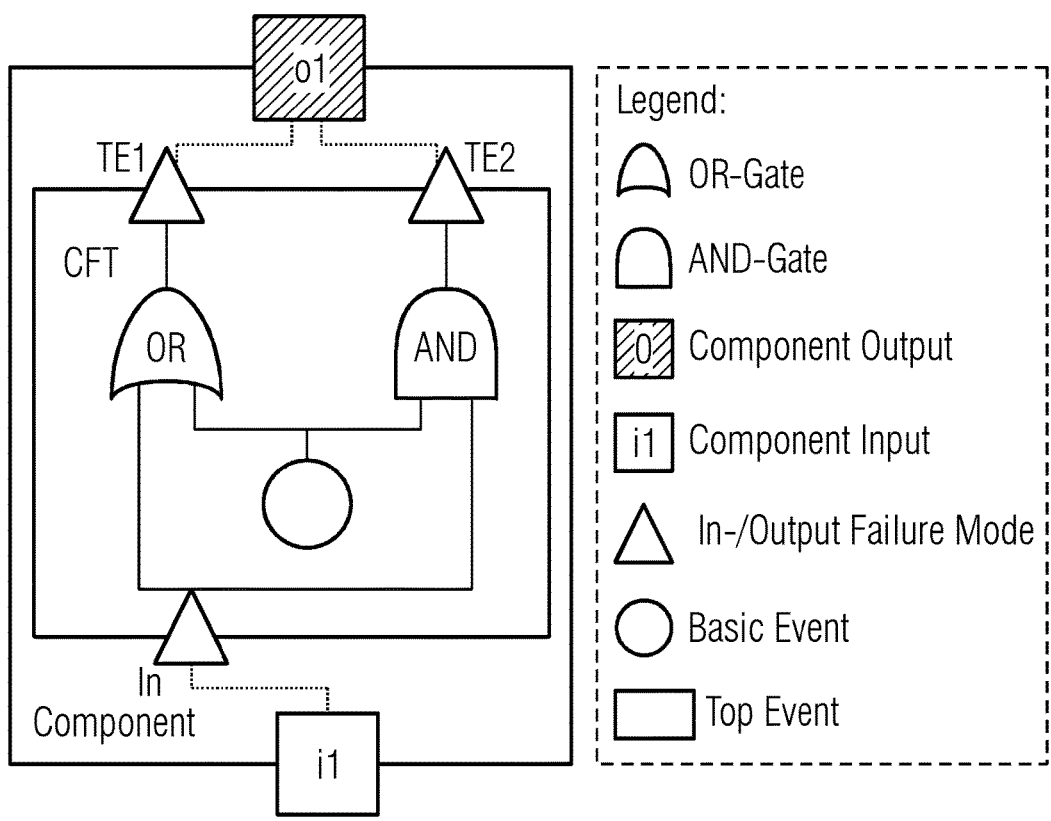

FIG. 5 schematically shows a Component Fault Tree (CFT) illustrating the operation of the method and apparatus, in accordance with embodiments of the present invention.

DETAILED DESCRIPTION

The component fault tree CFT is a Boolean data model associated to system development elements such as components. The component fault tree CFT has the same expressive power as a classic fault tree. FIG. 4 shows an example of a classic conventional fault tree and FIG. 5 shows an example of a component fault tree CFT. As classic fault trees, also component fault trees can be used to model failure behavior of a safety critical system. This failure behavior is used to document that the respective system is safe and can also be used to identify drawbacks of the system design. In component fault trees, a separate component fault tree element is related to the respective component c of the safety critical system, SCS. Failures that are visible at the outport of a component are modeled using output failure modes (OFM), which are related to the specific outport of the component fault tree CFT element. For modeling how specific failures propagate from an import e.g. i1 of a component c to an outport, input failure modes (IFM) are used. The inner failure behavior that also influences the output failure modes is modeled using gates such as a NOT gate, an AND gate or an OR gate, and so-called basic events, as also illustrated in FIG. 5. Every component fault tree CFT can be transformed to a classic fault tree by removing the input and output failure mode elements. FIG. 4 shows a classic fault tree and FIG. 5 shows a component fault tree. In both trees, the top events or output events TE1 and TE2 are modeled. The component fault tree CFT model allows, additionally to the Boolean formulae that are also modeled within the classic fault tree, to associate the specific top events to the corresponding ports where the failures can appear. For example, in FIG. 5, the top event TE1 appears at outport o1. When using component fault trees, a component fault tree element is related to a component. Failures that are visible at a specific outport of a component are modeled using Output Failure Modes. Failure modes that are relevant at the inports of a component are modeled using input failure modes as depicted using triangles in FIG. 5). Input failure modes and internal failure modes, so-called basic events, are combined using Boolean logic to model the occurrence of output failure modes (failure propagation). The traceability between structural model elements and component fault tree elements is for example beneficial for an increased maintainability of the safety analysis model. Every component fault tree can easily be transformed to a classic fault tree by removing the input and output failure mode elements. This step is typically done to analyze a network of component fault trees, since for classic fault tree analysis, the structural elements such as ports are no longer required. For any output failure mode, a fault tree can be synthesized from a CFT network in general. This involves the extraction of the Boolean failure propagation from any CFT contributing to the analyzed output failure mode by using the traces from input failure modes of a component's import over the port connection between components to output failure modes of another component's outports. This process is called CFT synthesis. If a classic fault tree can be composed for every output failure mode, the component fault tree network is called complete.

To show how CFTs can be used to foster model maturation in a component-based analysis. Let the System S consist of a set of components $C=\{c_1, \ldots, c_n\}$. Each component $c \in C$ includes a set of inports $IN(c)=\{in_1, \ldots in_p\}$ and a set of outports $OUT(c)=\{out_1, \ldots, out_q\}$. The information flow between the outport of a component $c_i \in C$ and the import of another component $c_j \in C$ is represented be a set of connections $$CON=\{(out_x, in_y) | out_x \in OUT(c_i), in_y \in IN(c_j)\}$$

Each component fault tree element $cft_i$ of a component $c_i \in C$ may have input failure modes $IFM(in_k)=\{if\ m_1, \ldots, if\ m_s\}$ which are related to the import $in_k \in IN(c_i)$ as well as output failure modes $OFM(out_l)=\{of\ m_1, \ldots, of\ m_r\}$ which are related to an outport $out_l \in OUT(c_i)$. Additionally, each component fault tree element has an internal Boolean logic that is used to model how input failure modes arriving at a component propagate in combination with internal causes to the output failure modes.

The CFT element of a component can be reused in different implementations. Where $cft^t$ is defined as the CFT element cft at time t with $cft^0$ is the initially created CFT element of the component c. Each time the CFT element is used in a different situation, it is $cft^t \rightarrow cft^{t+1}$.

In the following, cases are focused where the CFT element is modified when reused in a new context, more precisely, if the new situation requires an adaptation. This circumstance relates to the following implications:

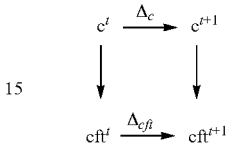

The modification of a component implies the modification of the CFT element, but not vice versa, since it is a safety analysis model.

Since component fault trees are addressing structural model elements such as components and their dependencies modeled by inports and outports, structural changes of the system model can influence CFT elements. Possible modifications $\Delta_c : c^t \rightarrow c^{t+1}$ of a single component $c \in C$ with $IN(c_i^t) \rightarrow IN(c_i^{t+1})$ or $OUT(c_i^t) \rightarrow OUT(c_i^{t+1})$ can be
the addition of inports with $IN(c_i^t) \subset IN(c_i^{t+1})$,
the removal of inports with $IN(c_i^t) \supset IN(c_i^{t+1})$
the addition of outports with $OUT(c_i^t) \subset OUT(c_i^{t+1})$
the removal of outports with $OUT(c_i^t) \supset OUT(c_i^{t+1})$ These modifications typically result in changes in the corresponding CFT element by adding or removing input or output failure modes. But not only structural changes during the reuse of a component can influence its safety analysis model. Also new failure modes that are related to the new situation require adaptation. Similar to the changes of in- and outports as described above, the set of input and output failure modes of a component $c \in C$ change over time with IFM $$IFM(in^t) \rightarrow IFM(in^{t+1}), in^t \in IN(c^t), in^{t+1} \in IN(c^{t+1})\ \text{and}$$

$$OFM(out^t) \rightarrow OFM(out^{t+1}), out^t \in OUT(c^t), out^{t+1} \in OUT(c^{t+1}).$$

If there are
additional input failure modes, it is $IFM(in^t) \subset IFM(in^{t+1})$
additional output failure modes, it is $OFM(out^t) \subset OFM(out^{t+1})$
removed input failure modes, it is $IFM(in^t) \supset IFM(in^{t+1})$
removed output failure modes, it is $OFM(out^t) \supset OFM(out^{t+1})$.

Figure 2:
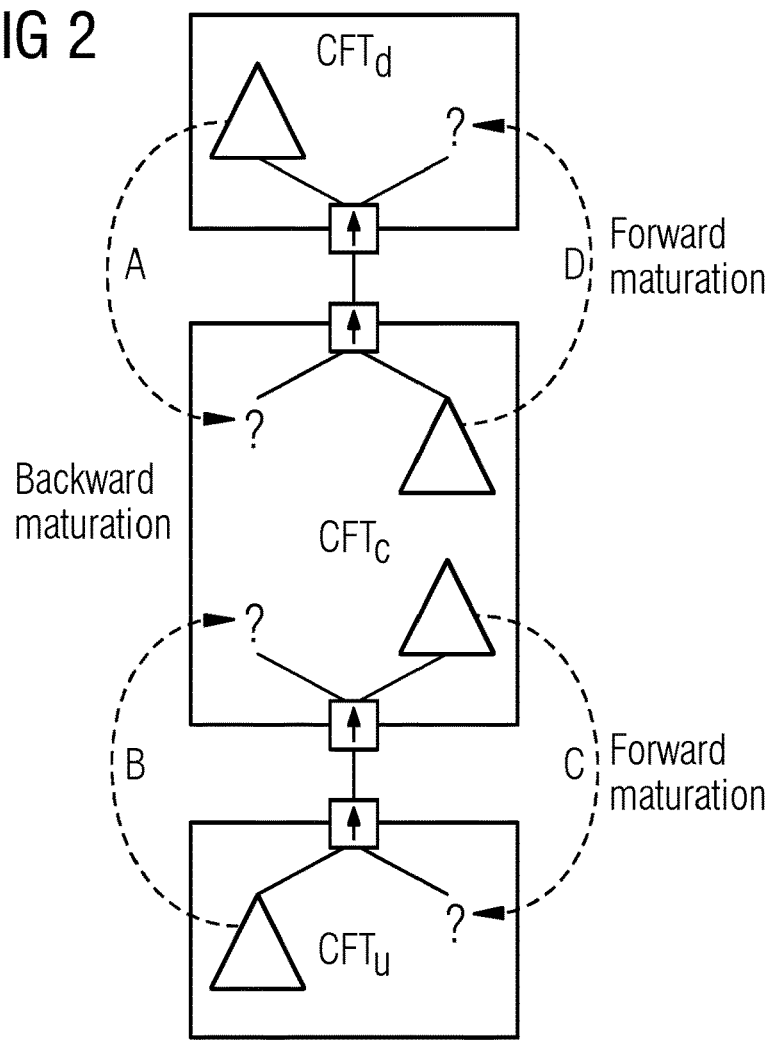
FIG. 2 shows an example of a system comprising components represented by interconnected component fault tree elements as employed by the method and apparatus.

If during the synthesis of a fault tree from a component fault tree network there are input failure modes that have no corresponding output failure mode, the CFT network is incomplete and the synthesis of classic fault trees for analysis fails for some output failure modes. If a component is reused in a new system and the corresponding CFT element is not the reason for an incomplete CFT network, the component is called integrated. If a failed integration of a component is to identify where the old context of a situation does not match the new context, the following inconsistencies result in a failed integration:

FIG. 2 shows different types of inconsistencies when integration a component fault tree of component c into a network of existing components u and d.

not all existing output failure modes can be connected to input failure modes of the component to be integrated (see example A in FIG. 2), not all existing input failure modes can be connected to output failure modes of the component to be integrated (see example B in FIG. 2), not all output failure modes of the component to be integrated can be connected to existing input failure modes (see example C in FIG. 2), or not all input failure modes of the component to be integrated can be connected to existing output failure modes (see example D in FIG. 2).

The input and output failure modes responsible for these inconsistencies can be identified automatically to help the engineer integrating a component. If the component to be integrated has a mature CFT model, its input and output failure modes carry the experience from other implementations into the new system.

Let cft∈CFT be such a component fault tree element of a component c∈C to be integrated into an existing network of component fault trees. Let $\{u_1, \ldots, u_n\} = U \subseteq C$ be the set of components from which a component c∈C receives inputs. This set is called the upstream components of c. Let $cft_1^u, \ldots, cft_n^u$ to be their component fault tree elements accordingly. Let $\{d_1, \ldots, d_m\} = D \subseteq C$ be the set of components to which $c_1 \in C$ propagates outputs to. This set is called the downstream components of c. Let $cft_1^d, \ldots, cft_m^d$ be their component fault tree elements accordingly.

A modification of a CFT element $\Delta_{cft}$ leads to inconsistencies in context with the other CFT elements of the system when composing the safety artifacts in order to perform a safety analysis. These inconsistencies can automatically be detected at the in- and outports of the component c to be integrated using $$\text{forward}(c) = \{fm | fm \in \text{OFM}(U) \cup \text{IFM}(D), \exists fm_c \in \text{OFM}(c) \cup \text{IFM}(c) : (fm \rightarrow fm_c) \vee (fm_c \rightarrow fm)\}$$

Using the previously defined sets forward(c) and backward(c) for a component c to be integrated into an existing system, the failure modes which require integration can be identified. The set forward(c) identifies unconnected failure modes of the component to be integrated and thereby transfers existing knowledge of the component into the new system where the component is reused (left side with examples A and B of FIG. 2). The set backward/c) contains unconnected failure modes of the existing system where c is to be integrated. This set transfers knowledge about the existing system back to the reused component (right side with examples C and D of FIG. 2). The information can be used to review the existing instances of c in other systems or implementations. So, solving the inconsistencies when reusing safety analysis models is beneficial for the system where such models are reused, but can also be beneficial to uncover safety issues in existing systems. Compositional safety analysis techniques, such as component fault trees, enable the general reuse of building blocks in this way.

Figure 3:
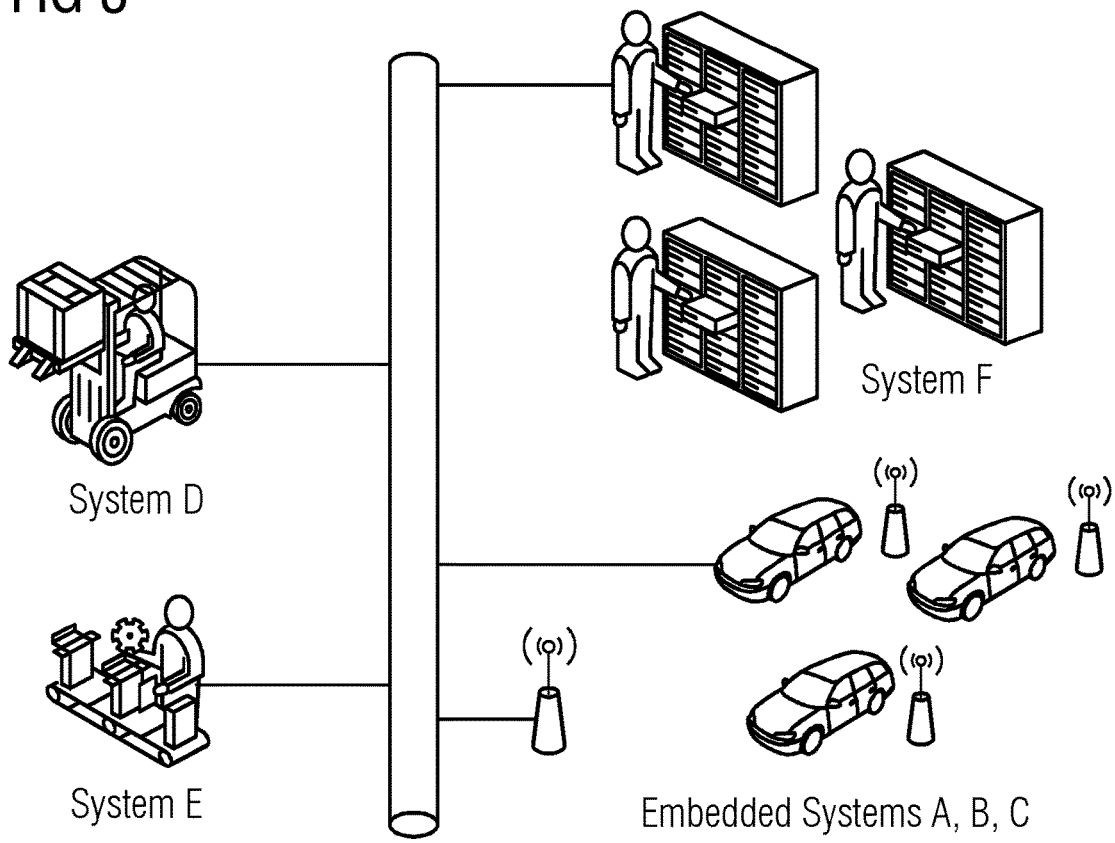
FIG. 3 illustrates a cyber-physical system as an area of application, in accordance with embodiments of the present invention.

FIG. 3 shows some possible participants in a loosely cyber-physical system. All participants Embedded Systems A, B, C and Systems D, E, F can possibly interact with each other for example via cable or wireless connection and execute the same function on different hardware. If one of these functions is reused in another system, e.g. system B uses autonomous driving from system D, it might require a recertication of the safety analysis model on the different hardware. If the information is present which part of the function of system D runs on which parts of the hardware of system B, the safety analysis models form B and D can be combined using the above described method to certify if the resulting system is performing its function the required quality in terms of functional safety. Furthermore, if a running system detects some faults for components that are also active in a different system, the afore mentioned method can be used to anticipate these faults in all existing instances of systems where the component is used in.

Figure 1:
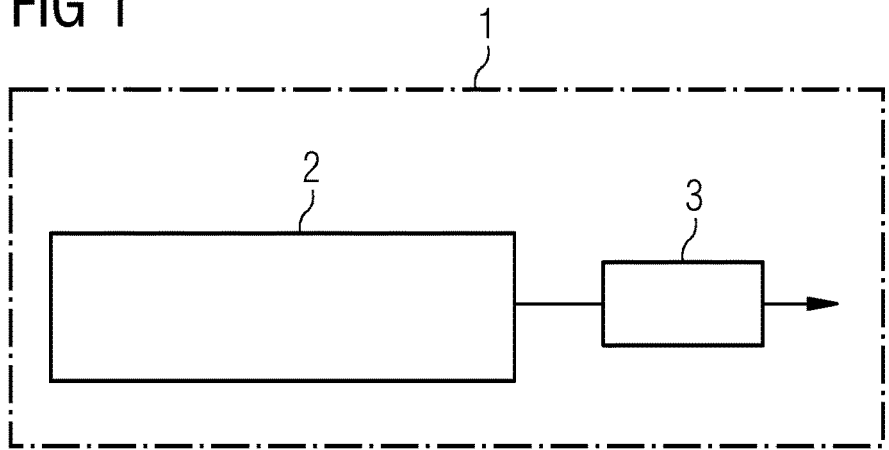

FIG. 1 illustrates a possible exemplary embodiment of an apparatus 1 adapted to provide a safe operation of a technical system, SCS, having a plurality of system components c. The functional safety behavior of each component c is represented by an associated component fault tree element which can be stored in a library or in a database.

As can be seen in FIG. 1, the apparatus 1 in the illustrated embodiment comprises a modeling unit 2 having the functionality to provide a safety analysis model matured by knowledge about former implementations of the respective system components in different context. The apparatus 1 further comprises an analysis unit having the functionality to uncover automatically inconsistencies caused by at least one system component to be integrated in context with at least another system component whereby the input and/or output failure mode of said system component carries the knowledge from former implementation into said context.

In order to uncover inconsistencies of the above mentioned type the component fault tree of the respective system components is analysed according to the above mentioned method.

It is to be understood that the elements and features recited in the appended claims may be combined in different ways to produce new claims that likewise fall within the scope of embodiments of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method for providing a safe operation of a technical system comprising a plurality of system components, the technical system including a computing system having a computer readable storage medium, the method comprising:
   a) providing, by the computing system, a safety analysis model of the technical system matured by knowledge about former implementations of the respective system components in different contexts;
   b) whereby dependencies of the system components are modelled by connecting inports with outports of the respective system components and/or by connecting outports with inports of the respective system components;
   c) whereby the inports and/or outports of each system component are associated with input failure modes and/or output failure modes of the respective system components;

d) automatically uncovering inconsistencies caused by at least one new system component to be integrated in connection with at least another downstream system component or upstream system component of an existing technical system, whereby the input failure modes and/or output failure modes of the system component to be integrated carries the knowledge from another implementation into a new context;

e) wherein for a system component to be integrated into the existing technical system, the failure modes which require integration and unconnected failure modes of the system component to be integrated are identified using a previously defined set forward which identifies unconnected failure modes of the system component to be integrated, whereby existing knowledge of the system component to be integrated is transferred into a new technical system where the component to be integrated is reused;

f) wherein for the system component to be integrated into the existing technical system, unconnected failure modes of the system component to be integrated are identified using a previously defined set backward which contains unconnected failure modes of the existing system components where the system component is to be integrated;

g) whereby existing knowledge of the existing system is transferred back to the reused system component of the technical system, whereby existing instances of the reused system component in other systems or implementations are reviewed.

2. The method according to claim 1, wherein maturation of the safety analysis model is effected when the system component to be integrated is reused.

3. The method according to claim 1, wherein the safety analysis model is represented by a component fault tree comprising a plurality of component fault tree elements, whereby each of the plurality of component fault tree elements comprises at least one component fault tree mode element representing an input failure mode or an output failure mode of the system component to be integrated which is represented by its component fault tree element.

4. The method according to claim 1, wherein the inconsistencies are detected at the inports and outports of the respective system components.

5. The method according to claim 1, wherein the knowledge about former implementations of the system components is stored in a repository.

6. A computer program product directly loadable into the internal memory of a computer, comprising software code portions for performing the steps of claim 1 when said computer program product is running on a computer.

7. A computing system comprising a computer readable storage medium for providing a safe operation of a technical system comprising a plurality of system components, comprising:

a) a modelling unit of the computing system for providing a safety analysis model of the technical system matured by knowledge about former implementations of the respective system components in different contexts;

b) whereby dependencies of system components dependencies are modelled by connecting inports with outports of the respective system components or by connecting outports with inports of the respective system components;

c) whereby the inports and/or outports of each system component are associated with input failure modes and/or output failure modes of the respective system component;

d) an analysis unit of the computing system for automatically uncovering inconsistencies caused by at least one new system component to be integrated in connection with at least another downstream system component or upstream system component of an existing technical system, whereby the input failures modes and/or output failure modes of the system component to be integrated carries the knowledge from another implementation into a new context;

e) wherein for a system component to be integrated into the existing technical system, the failure modes which require integration and unconnected failure modes of the system component to be integrated are identified using a previously defined set forward which identifies unconnected failure modes of the system component to be integrated, whereby existing knowledge of the system component to be integrated is transferred into a new technical system where the component to be integrated is reused;

f) wherein for the system component to be integrated into the existing technical system, unconnected failure modes of the system component to be integrated are identified using a previously defined set backward which contains unconnected failure modes of the existing system components where the system component is to be integrated;

g) whereby existing knowledge of the existing system is transferred back to the reused system component of the technical system, whereby existing instances of the reused system component in other systems or implementations are reviewed.

8. The apparatus according to claim 7, wherein maturation of the safety analysis model is effected when the system component to be integrated is reused.

9. The apparatus according to claim 7, wherein the safety analysis model is represented by a component fault tree comprising a plurality of component fault tree elements, whereby each of the component fault tree elements comprises at least one component fault tree mode element representing a failure mode of the system component which is represented by the component fault tree element.

10. The apparatus according to claim 7, wherein the inconsistencies are detected at the inports and outports of the respective system components.

11. The apparatus according to claim 7, wherein said knowledge about former implementations of the system components is stored in a repository.

* * * * *